United States Patent [19]

Morita et al.

[11] Patent Number: 5,073,813
[45] Date of Patent: Dec. 17, 1991

[54] SEMICONDUCTOR DEVICE HAVING BURIED ELEMENT ISOLATION REGION

[75] Inventors: Shigeru Morita, Kawasaki; Kikuo Yamabe, Yokohama, both of Japan; Masakazu Kakumu, Mountain View, Calif.

[73] Assignee: Kabushiki Kaisha Toshiba, Kawasaki, Japan

[21] Appl. No.: 557,716

[22] Filed: Jul. 26, 1990

[30] Foreign Application Priority Data

Jul. 27, 1989 [JP] Japan ................................. 1-192505

[51] Int. Cl.⁵ ........................................... H01L 27/12
[52] U.S. Cl. ....................................... 357/49; 357/71; 357/47; 357/23.11
[58] Field of Search .................... 357/49, 71, 47, 23.11, 357/55, 54, 41, 71, 71 S, 65, 49, 59 G, 59 I

[56] References Cited

U.S. PATENT DOCUMENTS

| | | | |
|---|---|---|---|
| 4,532,696 | 8/1985 | Iwai | 29/571 |
| 4,740,480 | 4/1988 | Ooka | 357/49 |
| 4,924,284 | 5/1990 | Beyer et al. | 357/49 |
| 4,935,800 | 6/1990 | Taguchi | 357/49 |

Primary Examiner—William Mintel
Assistant Examiner—Roy Potter
Attorney, Agent, or Firm—Finnegan, Henderson, Farabow, Garrett, and Dunner

[57] ABSTRACT

A MOS structure is formed on a silicon semiconductor substrate surface using a first gate electrode film made of polysilicon, an element isolation groove reaching the inside of the silicon semiconductor substrate is formed, and an insulating film is filled in the groove. In addition, a second gate electrode film made of a refractory metal such as molybdenum silicide is formed to be connected to the first gate electrode film, and the first and second gate electrode films are simultaneously removed to form a MOS gate electrode and a wiring layer.

7 Claims, 8 Drawing Sheets

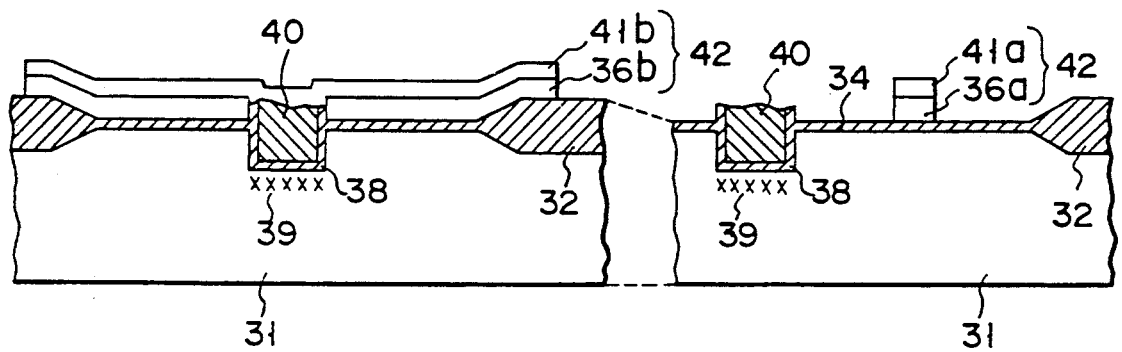
F I G. 2 I
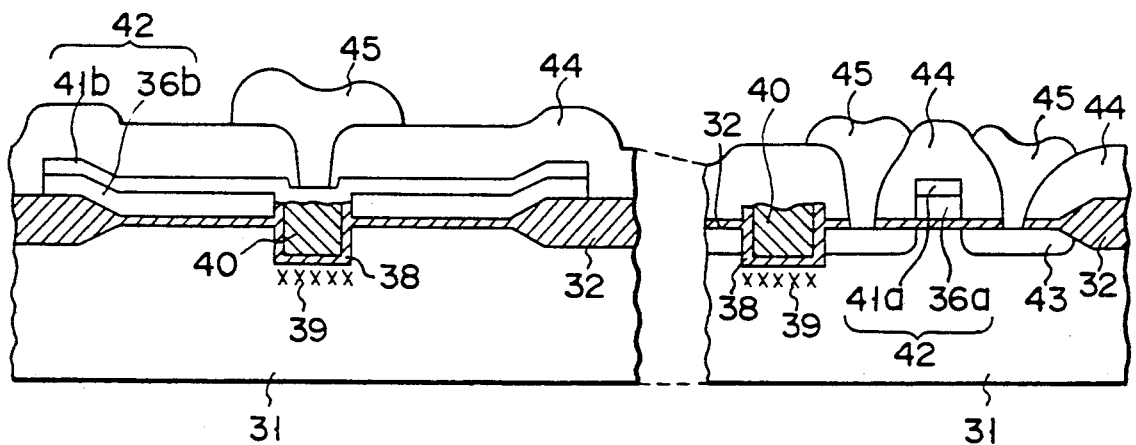
F I G. 2 J

SEMICONDUCTOR DEVICE HAVING BURIED ELEMENT ISOLATION REGION

BACKGROUND OF THE INVENTION

1. Field of the Invention

The present invention relates to a semiconductor device having a buried element isolation region by burying an insulator in a micropatterned groove formed in a semiconductor substrate and a method of manufacturing the same.

2. Description of the Related Art

In order to form a large number of semiconductor elements in a semiconductor substrate so as to isolate them from each other, the following method is known. That is, an insulator is buried in a micropatterned groove formed in the semiconductor substrate to form an element isolation region, and semiconductor elements are formed in the semiconductor regions isolated by the element isolation region. For example, a method of manufacturing a semiconductor device in which an insulator is buried in a groove to form an element isolation region is disclosed in U.S. Pat. No. 4,532,696. In the semiconductor device disclosed in the U.S. Pat. No. 4,532,696, the surface of a semiconductor substrate is covered with an insulating film, and semiconductor regions isolated by an element isolation region are connected by an aluminum wire through a contact hole formed in the insulating film.

There is, however, a semiconductor device in which two adjacent semiconductor regions are directly connected with each other to form a conductive layer along the substrate surface without formation of a contact hole. In this case, a step is formed in a portion of the groove on which an element isolation region is formed, and the conductive layer formed on this step may be disconnected.

A conventional method of manufacturing a semiconductor device will be described below with reference to FIGS. 1A to 1K.

As shown in FIG. 1A, a mask material 13 (SiN$_3$, SiO$_2$, or the like) is deposited on an oxide film 12 of a semiconductor substrate 11. As shown in FIG. 1B, a resist film 14 having a groove pattern 15 is formed by a photoresist method. As shown in FIG. 1C, anisotropic etching such as RIE (Reactive Ion Etching) is performed for the groove pattern 15 using the resist film 14 as a mask to continuously etch the mask material 13, the oxide film 12, and the semiconductor substrate 11 so as to form a groove 16 corresponding to the groove pattern 15.

As shown in FIG. 1D, after the resist film 14 is removed, an insulating film 17 is deposited in the groove 16 represented by a broken line and on the entire surface of the substrate 11 by a CVD method, and the insulating film 17 is anisotropically etched and left in the groove 16. The residual insulating film 17 is etched back by an etchant 18 such that the upper surface of the insulating film 17 is located between the upper and lower surfaces of the mask material 13.

As shown in FIG. 1E, the mask material 13 is removed to project the upper surface of the insulating film 17 from the upper surface of the oxide film 12.

A gate electrode material is deposited on the entire surface of the resultant structure, and a resist film (not shown) is formed by a photoresist method. Thereafter, anisotropic etching is performed using the resist film as a mask, and the resist film is removed after this etching. As shown in FIG. 1F, a gate electrode 19 is formed.

In the semiconductor device with the above arrangement, poor step coverage 20 of the gate electrode 19 occurs in the step portion between the buried insulating film 17 and the oxide film 12 to degrade the conductivity of the semiconductor device.

In the above manufacturing method, the mask material 13 is used. The second conventional manufacturing method without using the mask material will be described below.

As shown in FIG. 1G, an oxide film 12 is formed on a semiconductor substrate 11.

As shown in FIG. 1H, a resist film 14 having a groove pattern 15 is formed by a photoresist method on an oxide film 12.

As shown in FIG. 1I, the oxide film 12 and the semiconductor substrate 11 are continuously and anisotropically etched by an etchant 21 using the resist film 14 as a mask to form a groove 16.

As shown in FIG. 1J, after the resist film 14 is removed, an insulating film 17 is deposited in the groove 16 and on the entire surface of the substrate using a CVD method, and the insulating film 17 is anisotropically etched back. The residual insulating film 17 is etched such that the upper surface of the insulating film 17 is lower than the upper surface of the oxide film 12.

A gate electrode material is deposited on the entire surface of the substrate 11, and a resist film (not shown) is formed by a photoresist method. Thereafter, anisotropic etching is performed using the resist film as a mask, and the resist film is removed after this etching. As shown in FIG. 1K, a gate electrode 22 is formed.

In the semiconductor substrate with the above arrangement, when over-etching is performed during formation of the gate electrode 22, the semiconductor substrate 11 under the insulating film 12 is adversely affected. Therefore, this over-etching cannot be performed. For this reason, an etching residue 22' of the gate electrode material is formed on the groove 16. The etching residue is formed between a plurality of semiconductor devices formed in a direction perpendicular to the drawing surface, thereby causing electrical short-circuiting.

Even if either conventional method is used in the corresponding conventional semiconductor device, the semiconductor substrate surface is roughened, and poor step coverage of a wiring and short-circuiting caused by an etching residue of a wiring material occur.

As described above, in the conventional semiconductor device, poor step coverage of the wiring occurs due to unevenness of the semiconductor substrate surface and buried insulating film surface, and degradation of conductivity of the semiconductor device and shortcircuiting occur.

SUMMARY OF THE INVENTION

It is, therefore, an object of the present invention to provide a semiconductor device having a stable wiring layer which is not affected by unevenness of an insulating film surface and a semiconductor substrate surface and the method of manufacturing the device.

According to a semiconductor device and the method of manufacturing the same of the present invention, a gate electrode is formed by first and second conductive films, wherein the second conductive film is formed on a buried insulating film (second insulating film).

After a first insulating film and a first conductive film are sequentially formed on a semiconductor substrate, the first conductive film, the first insulating film, and the semiconductor substrate are continuously etched to form a groove. Thereafter, a second insulating film for burying the groove is formed in the groove and on the first conductive film, the second insulating film is anisotropically etched back such that a surface of the second insulating film is located between upper and lower surfaces of a first gate electrode material. A second conductive film is formed on an entire surface of the substrate, and the second conductive film and first conductive film are continuously etched to form a required gate electrode.

In a semiconductor device manufactured by the above method, the film thickness of a second gate electrode material on a second insulating film is larger than the film thickness of a gate electrode material made of a first gate electrode material and the second electrode material on a semiconductor substrate. Therefore, when the second gate electrode material is removed from a groove upon etching of the gate electrode material, the gate electrode on the semiconductor substrate is not over-etched, and an etching residue of the gate electrode material of the groove is not formed. In addition, since the second insulating film surface is formed to be located between upper and lower surfaces of the second gate electrode material, the first gate electrode material does not cause poor step coverage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2J are views showing a method of manufacturing a semiconductor device according to an embodiment of the present invention;

DETAILED DESCRIPTION OF THE PREFERRED EMBODIMENTS

Figure 1A:
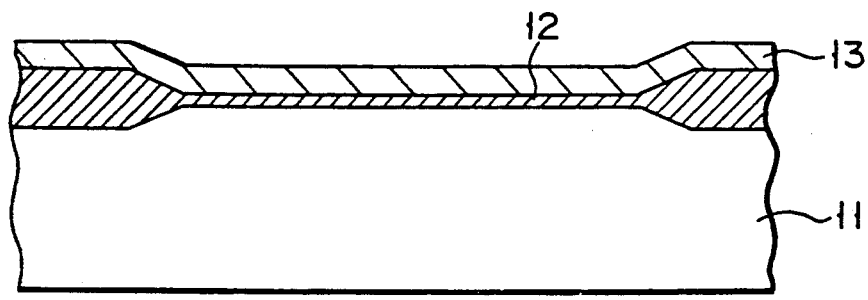
FIGS. 1A to 1F are views showing a conventional method of manufacturing a semiconductor device.
Figure 1B:
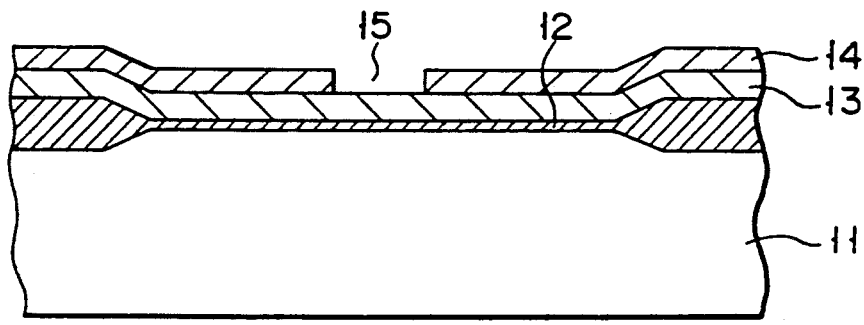
Figure 1C:
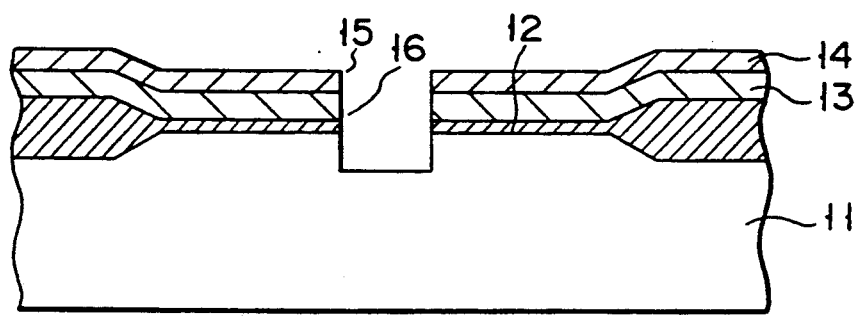
Figure 1D:
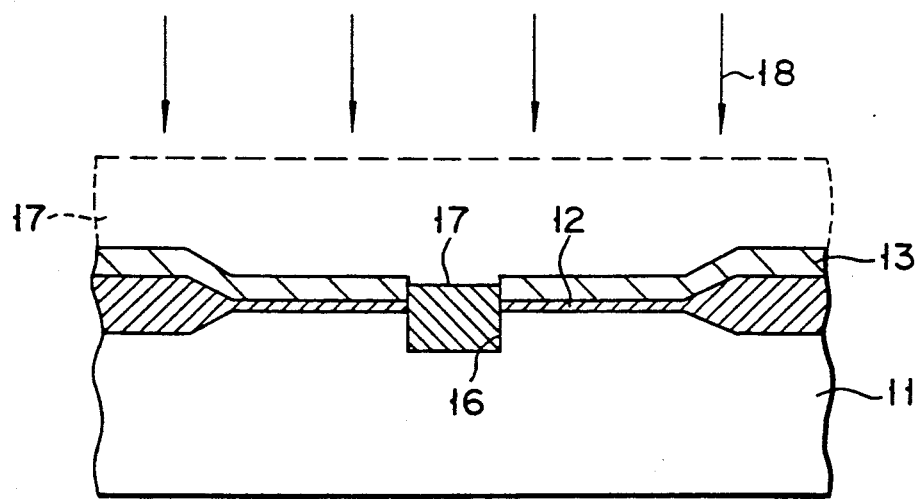
Figure 1E:
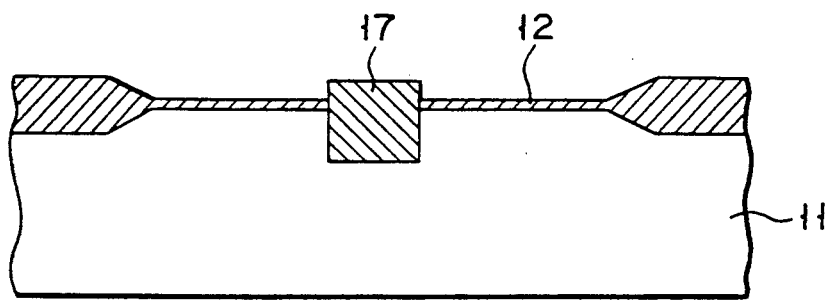
Figure 1F:
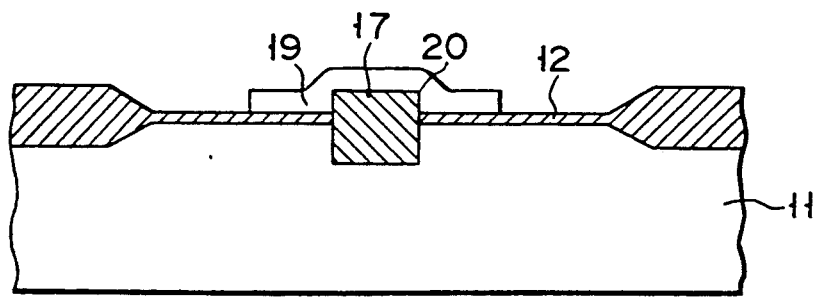
Figure 1G:
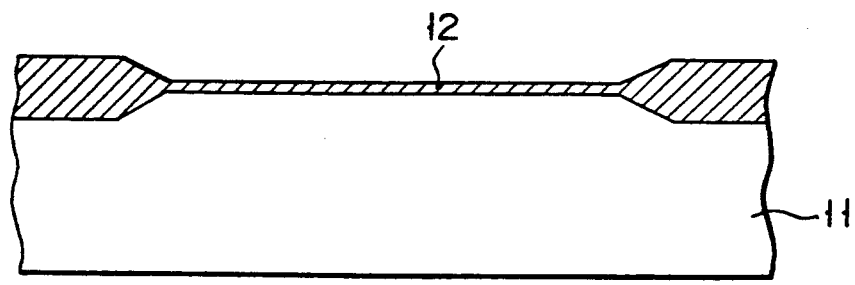
FIGS. 1G to 1K are views showing another conventional method of manufacturing a semiconductor device.
Figure 1H:
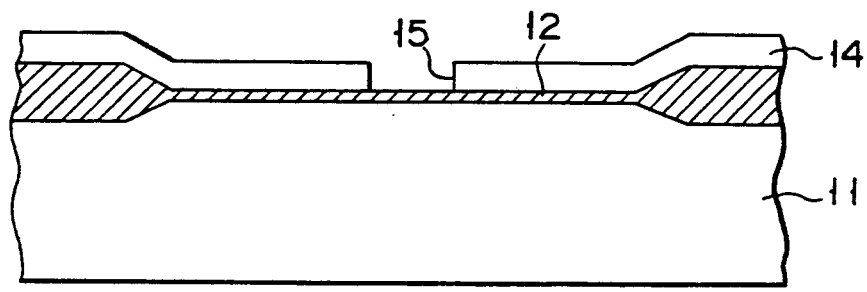
Figure 1I:
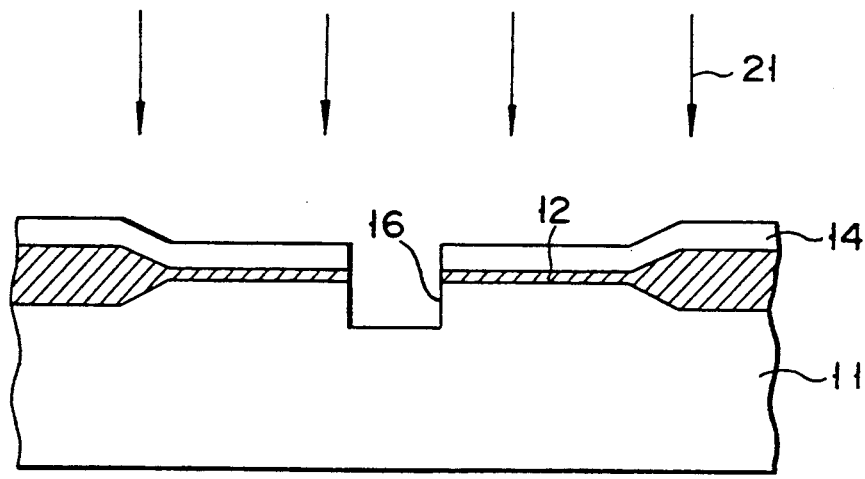
Figure 1J:
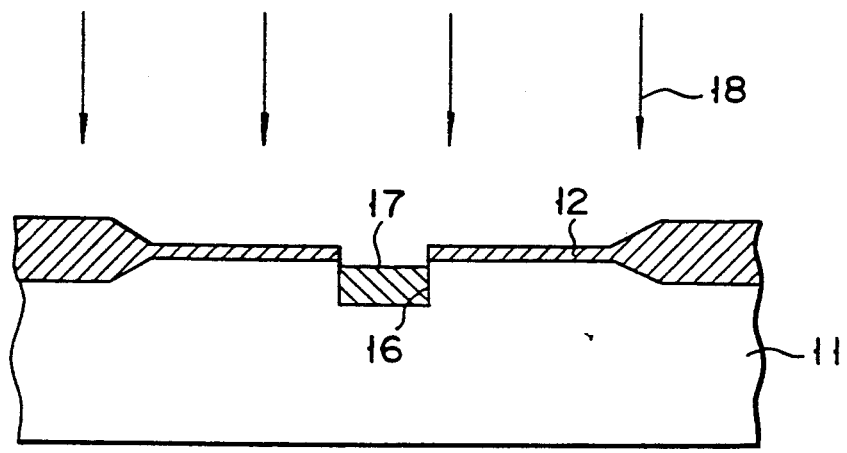
Figure 1K:
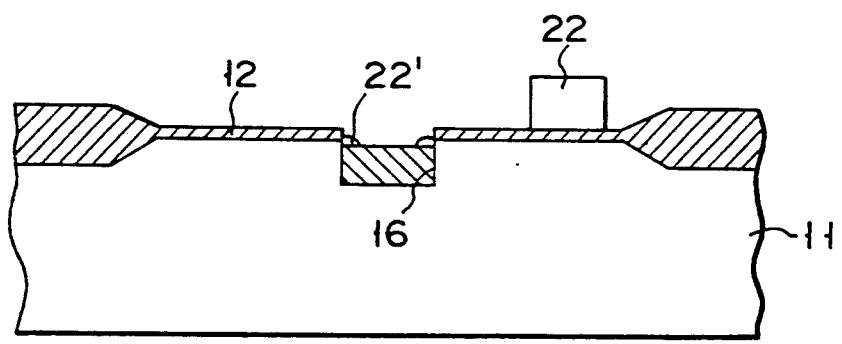
Figure 2A:
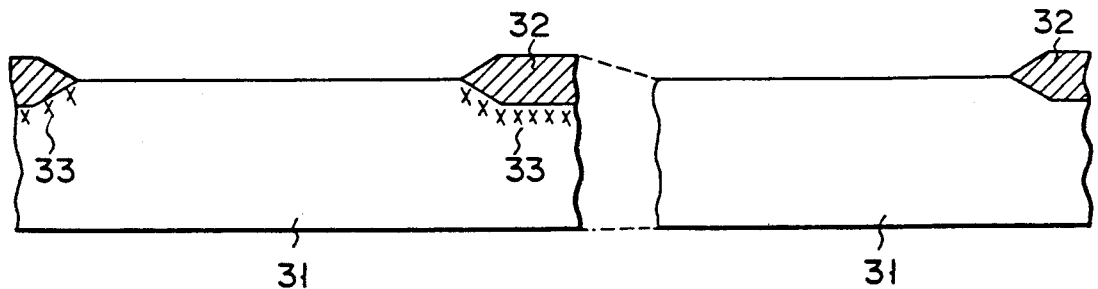

An embodiment of a semiconductor device and a method of manufacturing the device according to the present invention will be described with reference to FIGS. 2A to 2J. As shown in FIG. 2A, a field oxide film 32 ($SiO_2$) having a thickness of about 600 nm is formed by a LOCOS method in a desired region on a p-type silicon substrate (semiconductor substrate) 31 having a resistivity of about 1 to 2 $\Omega \cdot cm$. Before formation of the field oxide film 32, B (boron) ions are implanted in the surface of the silicon substrate 31 under the field oxide film 32 at an acceleration voltage of 100 keV and a dose of $4 \times 10^{13}$ $cm^{-2}$ using a silicon nitride film for selective oxidation to form an inversion preventive layer 33.

Figure 2B:
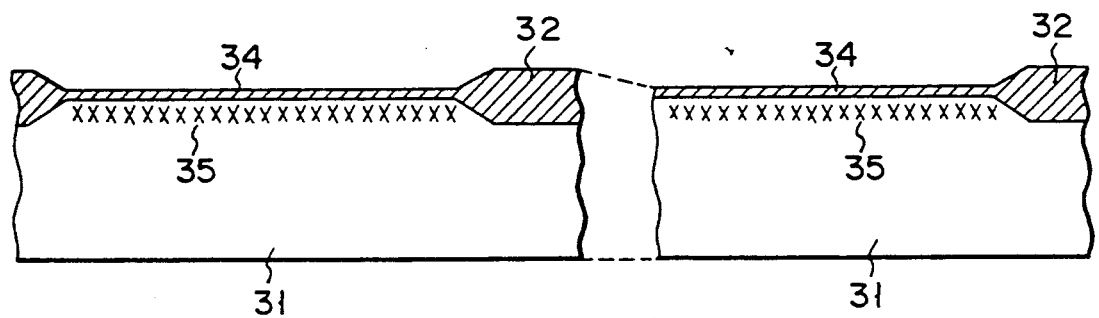

As shown in FIG. 2B, a gate oxide film ($SiO_2$, a first insulating film) 34 is formed on the semiconductor substrate 31 by a thermal oxidation method (1,000° C., dry $O_2$).

Channel ion implantation (B ions, 35 keV, $1 \times 10^{12}$ $cm^{-2}$) is performed by an ion implantation method as needed to form a channel ion implantation region 35 for controlling a threshold value.

Figure 2C:
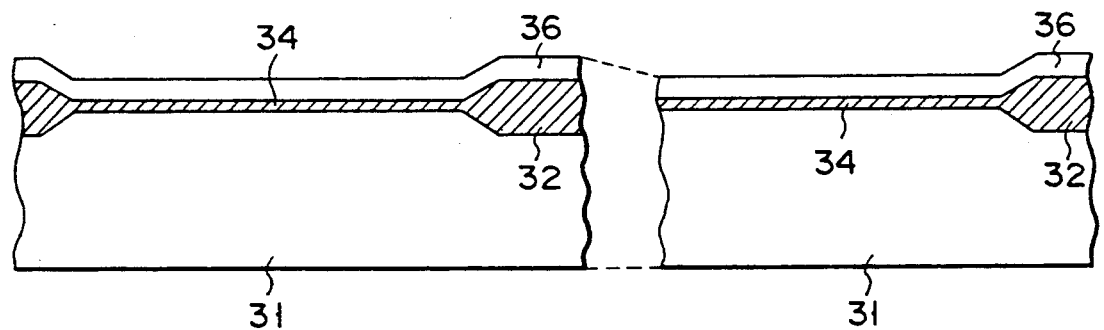

As shown in FIG. 2C, a first conductive film (polysilicon) 36 is formed on the entire surface of the resultant structure to have a thickness of about 300 nm. Subsequently, a P (phosphorus) impurity is implanted in the first conductive film 36 by epitaxial diffusion (900° C., $POCl_3$) to obtain a desirable resistivity.

Figure 2D:
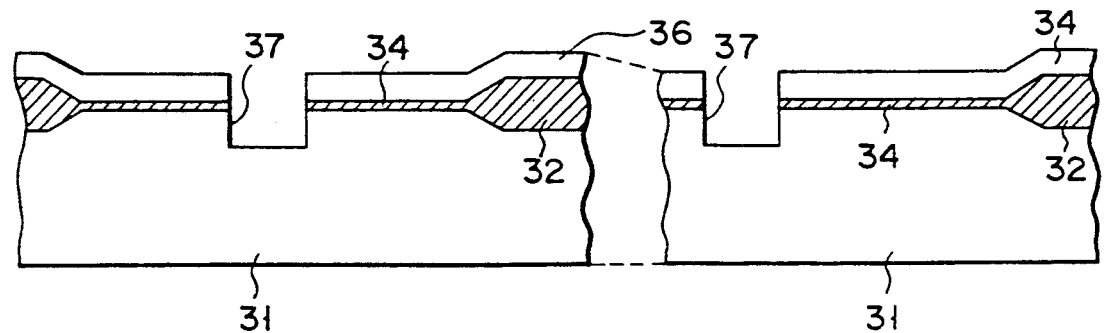

A resist film (not shown) is formed on the first conductive film 36 using a photoresist method, and the first conductive film 36, the gate oxide film 34, and the silicon substrate 31 are continuously and anisotropically etched by an RIE method to form a groove 37 having a groove width of 0.5 to 1.2 $\mu m$ and a groove depth of 0.5 $\mu m$ in the silicon substrate 31, as shown in FIG. 2D.

Figure 2E:
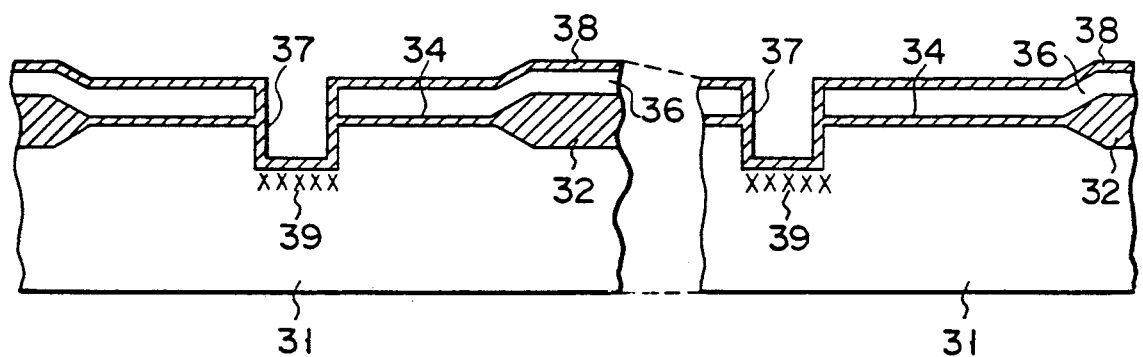

As shown in FIG. 2E, an insulating oxide film 38 ($SiO_2$) is formed in the groove 37 and on the surface of the first conductive film 36 by a thermal oxide method (900° C., dry $O_2$) to have a thickness of about 10 nm, and field ions (B ions, 30 keV, $4 \times 10^{13}$ $cm^{-2}$) are implanted in the bottom of the groove 37 using a first conductive film 36 as a mask to form an inversion preventive layer 39.

Figure 2F:
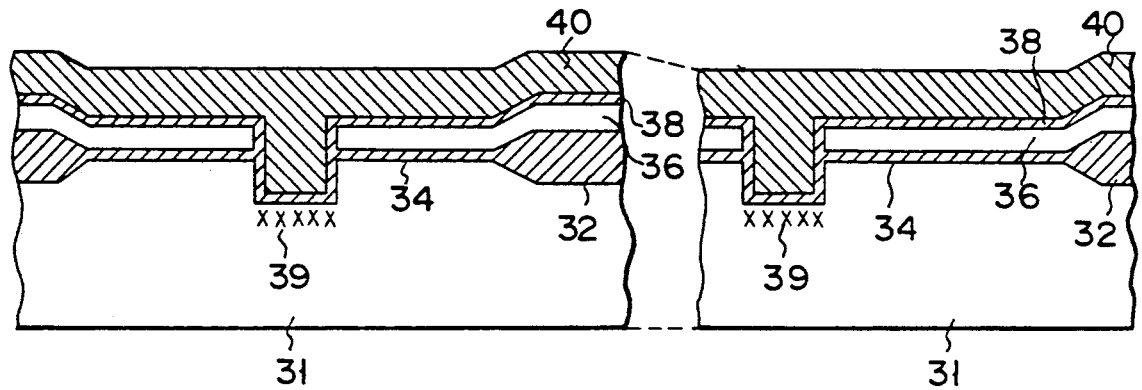

As shown in FIG. 2F, a second insulating film ($SiO_2$) 40 is formed in the groove 37 and on the oxide film 38 by an LPCVD (Low-Pressure Chemical Vapor Deposition) method. In this case, since the groove 37 has a width of about 0.5 to 1.2 $\mu m$, the second insulating film 40 has a thickness of about 600 nm.

Figure 2G:
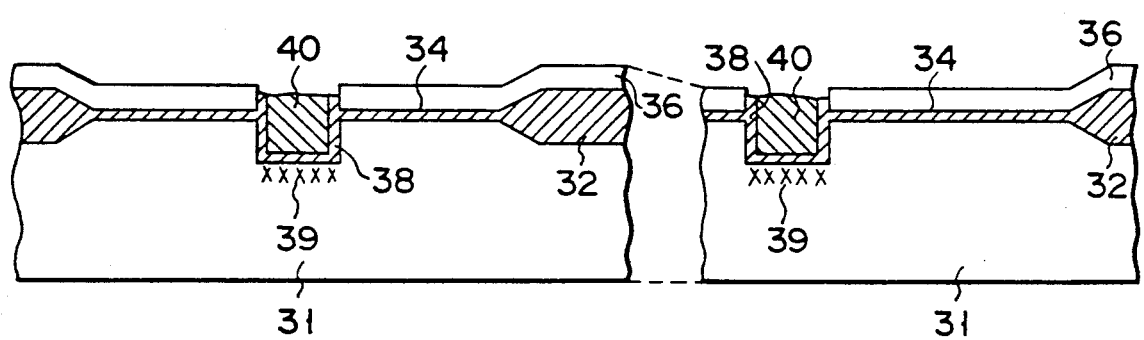

As shown in FIG. 2G, the entire surface of the resultant structure is anisotropically etched back to remove the second insulating film 40 from the first conductive film 36. In this case, this etching is performed for a time longer than the etching time required to remove the second insulating film 40 from the first conductive film 36 by about 20%. Thus, the buried insulating film 40 in the groove 37 is formed to be located between the upper and lower surfaces of the first conductive film 36. At the same time, the oxide film 38 is removed from the first conductive film 36.

Figure 2H:
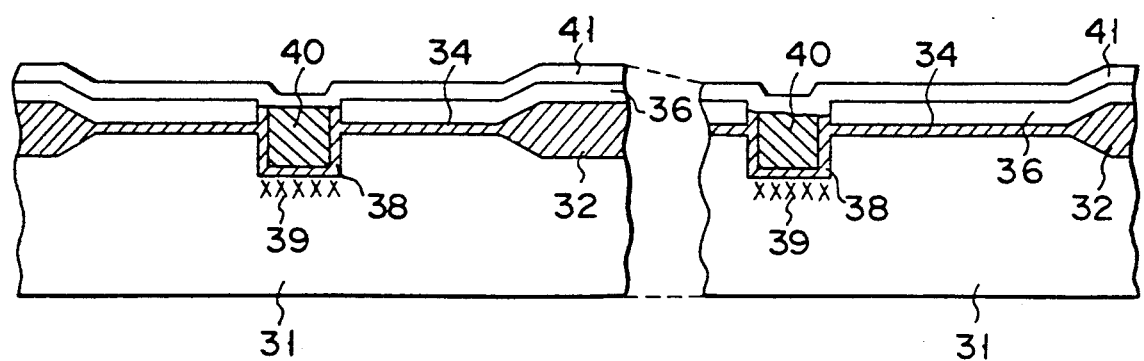

As shown in FIG. 2H, a molybdenum silicide (MoSi) film is deposited on the entire surface of the resultant structure to have a thickness of 200 nm by a sputter method or the like so as to form a second conductive film 41.

A resist film (not shown) is formed on the second conductive film 41 by a photoresist method, and the second conductive film 41 and the first conductive film 36 are continuously and anisotropically etched back using the resist film as a mask to form a second gate electrode 41a and a first gate electrode 36a, as shown in FIG. 2J. The first gate electrodes 36a separated from each other by the second insulating film 40, selecting the etching pattern, can be electrically conducted as needed by a structure bridged by the second gate electrode 41b, as shown in FIG. 2I.

At this time, a gate electrode 42 constituted by the first gate electrode 36b and the second gate electrode 41b extends from the upper portion of the second insulating film 40 to the upper portion of the field oxide film 32 so as to serve as a gate electrode between the second insulating film 40 and the field oxide film 32. Thereafter, as shown in FIG. 2J, an n+-diffusion layer 43 serving as a source or drain region, an interwiring insulating film 44, and a lead electrode wiring layer 45 (Al) are formed to form a required element on the silicon substrate.

Figure 3:
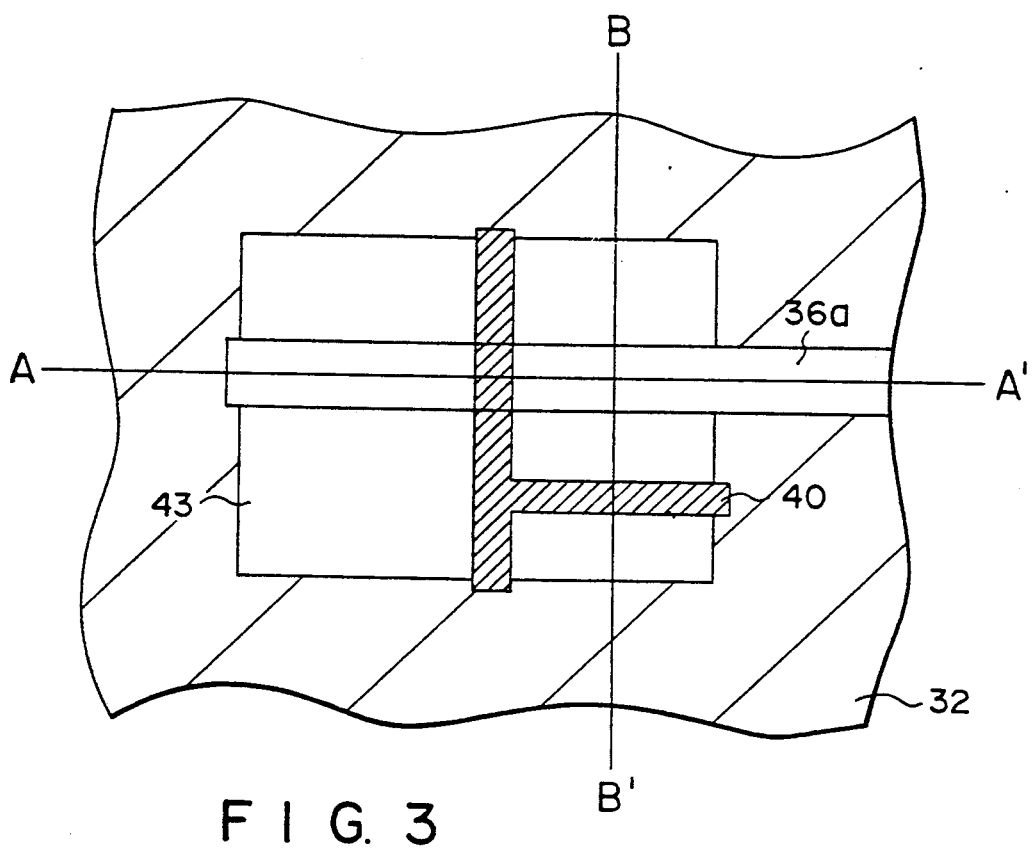
FIG. 3 is a plan view showing the semiconductor device shown in FIGS. 2A to 2J.

A semiconductor device according to this embodiment is formed as shown in a plan view in FIG. 3. A sectional view showing the semiconductor device in FIG. 3 taken along a line A-A' shows the left side of FIG. 2I, and a sectional view showing the semiconductor device in FIG. 3 taken along a line B-B' shows the right side of FIG. 2I.

Note that, in this embodiment, the second conductive films 41a and 41b are made of molybdenum silicide, but a refractory metal such as W (tungsten) and Ti (titanium) or a refractory metal silicide may be used.

The second insulating film 40 is an oxide film, but may be a nitride (SiN) film.

Figure 4:
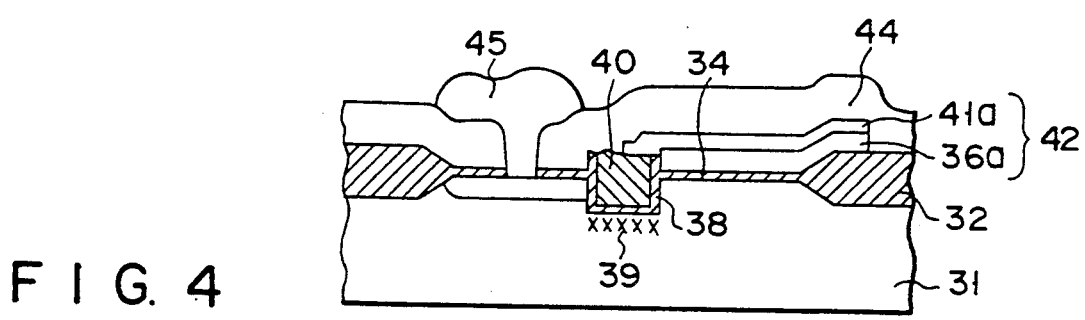
FIG. 4 is a sectional view showing a semiconductor device according to another embodiment of the present invention.

The second embodiment of the present invention will be described below. An etching pattern of the gate electrode is selected to form a gate electrode 42, the end of which reaches the upper portion of the buried insulating film 40, as shown in FIG. 4.

In the first and second embodiments, as shown in the left side of FIG. 2I, since the second insulating film 40 is formed to have a surface level lower than that of the upper surface of the first conductive film 36b, the second conductive film 41b does not cause poor step coverage on the second insulating film 40. Therefore, degradation of the conductivity of the semiconductor device can be prevented. In addition, since the film thickness of the gate electrode material constituted by the first and second conductive films 36b and 41b and formed on the silicon substrate 31 is larger than that of the second conductive film 41b formed on the second insulating film 40, as shown on the right side of FIG. 2I, even when the gate electrode 42 (36a, 41a) is excessively over-etched, the second conductive film 41a and the first conductive film 36a can be removed without adversely affecting the silicon substrate 31. For this reason, the over-etching can be performed, and electrical short-circuiting of the semiconductor device can be prevented since the etching residue of the gate electrode 42 is not formed on the second insulating film 40. Furthermore, in the semiconductor device according to the present invention, the surface of the second insulating film 40 can be formed between the upper and lower surfaces of the first conductive film 36. When buried insulating film 40 has a large thickness, element isolation is effective. Therefore, a good element isolation effect can be obtained.

Figure 5:
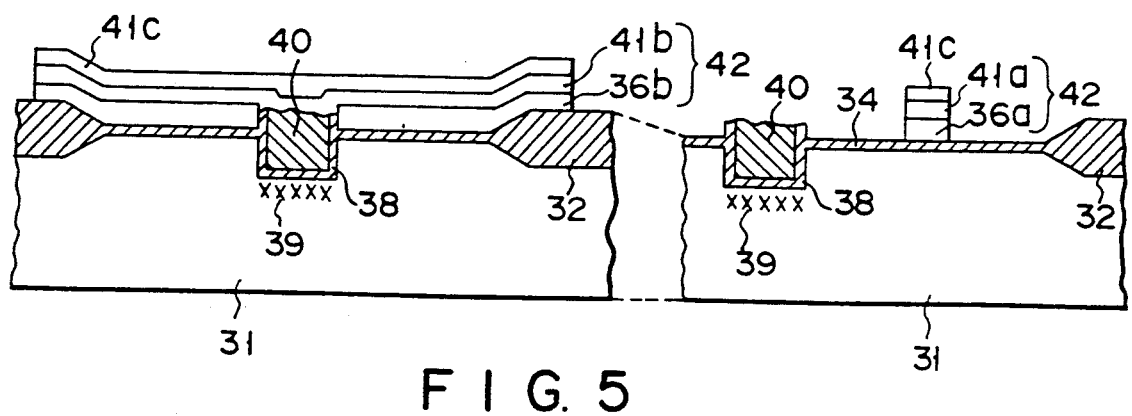
FIG. 5 is a sectional view showing a semiconductor device according to still another embodiment of the present invention.

In the embodiment in FIG. 2I, a two-layer gate structure (41b+36b) is used as the gate electrode 42. However, these two layers are made of polysilicon, as shown in FIG. 5, and a conductive layer 41c made of molybdenum silicide may be formed thereon. In this case, since the first layer 36b and the second layer 41b are made of polysilicon, the connecting state between the first and second layers is excellent on the insulating film 40.

As has been described above, according to the present invention, poor step coverage or an etching residue can be eliminated using first and second conductive films, and a semiconductor device having a stable wiring layer can be provided.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device produced by:
   forming a first conductive film on a first insulating film formed on a semiconductor substrate,
   forming a groove in said first conductive film and said first insulating film, with said groove extending into a portion of said semiconductor substrate,
   forming a second insulating film in said groove up to a level between upper and lower surfaces of said first conductive film,
   thereafter forming a second conductive film on said first conductive film and said second insulating film,
   forming a gate electrode from said second conductive film and said first conductive film, and
   forming source and drain regions in a surface region of said semiconductor substrate with each having one end which is adjacent to said gate electrode.

2. A device according to claim 1, wherein said first conductive film is separated into two sections by said second insulating film, the second conductive film is bridged over said two sections of said first conductive film, and said first conductive film is electrically connected by said second conductive film.

3. A device according to claim 1, wherein said first conductive film is constituted by a film containing polysilicon, and said second conductive film is constituted by a refractory metal or a silicon film containing a refractory metal.

4. A device according to claim 1, wherein an area to be isolated is surrounded by an isolation film with said gate electrode being formed within said area and a portion thereof constituting said second conductive film extending on said isolation film and across said area.

5. A device according to claim 1, wherein an area to be isolated is surrounded by an isolation film, with a portion of said gate electrode constituting said first conductive film being formed within said area and another portion of said gate electrode constituting said second conductive film being formed on and extending across said isolation film.

6. The device according to claim 1, wherein a third conductive film is deposited on said second conductive film.

7. The device according to claim 6, wherein said third conductive film is molybdenum silicide.

* * * * *